United States Patent
Ma et al.

(10) Patent No.: US 7,969,743 B2
(45) Date of Patent: Jun. 28, 2011

(54) HEAT SINK ASSEMBLY WITH TEMPERATURE DISPLAY

(75) Inventors: Xiao-Feng Ma, Shenzhen (CN); Lei Liu, Shenzhen (CN); Chia-Shin Chou, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 93 days.

(21) Appl. No.: 12/501,484

(22) Filed: Jul. 12, 2009

(65) Prior Publication Data

US 2010/0328897 A1    Dec. 30, 2010

(30) Foreign Application Priority Data

Jun. 25, 2009   (CN) .......................... 2009 1 0303692

(51) Int. Cl.
*H05K 7/20* (2006.01)
*G01R 31/26* (2006.01)
*G01K 7/02* (2006.01)
*G01K 1/14* (2006.01)

(52) U.S. Cl. .................. 361/710; 361/679.54; 361/704; 361/709; 324/762.02; 374/141; 374/170

(58) Field of Classification Search ............. 361/679.46, 361/679.54, 688, 690, 703–704, 709–710, 361/719; 165/80.2–80.3, 185; 174/16.3; 324/762.02, 763.01; 374/141, 170
See application file for complete search history.

(56) References Cited

U.S. PATENT DOCUMENTS

| | | | |
|---|---|---|---|
| 5,847,452 A * | 12/1998 | Tantoush | 257/722 |
| 5,911,897 A * | 6/1999 | Hamilton | 219/497 |
| 6,209,623 B1 * | 4/2001 | Tantoush | 165/80.3 |
| 6,577,146 B2 * | 6/2003 | Gamache et al. | 324/750.05 |
| 7,549,790 B2 * | 6/2009 | Ye et al. | 374/43 |
| 7,578,614 B2 * | 8/2009 | Chen et al. | 374/44 |
| 2008/0130705 A1 * | 6/2008 | Chen et al. | 374/43 |
| 2010/0103624 A1 * | 4/2010 | Chen et al. | 361/710 |

* cited by examiner

Primary Examiner — Robert J Hoffberg
(74) Attorney, Agent, or Firm — Zhigang Ma

(57) ABSTRACT

A heat sink assembly dissipates heat of a chip on a circuit board. A temperature collecting module of the heat sink assembly senses temperature of the chip and generates corresponding analog signals. A display module of the heat sink assembly receives the analog signals and converts the analog signals into digital signals, and then displays the digital signals with temperature unit symbol.

7 Claims, 3 Drawing Sheets

HEAT SINK ASSEMBLY WITH TEMPERATURE DISPLAY

BACKGROUND

1. Technical Field

The present disclosure relates to heat sinks and, particularly, to a heat sink assembly which can display temperature.

2. Description of Related Art

For testing electronic devices, such as central processing units (CPUs), south bridge chips, and north bridge chips, detecting temperatures of these electronic devices is very important for testers to determine whether the electronic devices are OK. Usually, an extra detecting device needs to be prepared for detecting temperatures of the electronic devices. However, the extra detecting device may be expensive and inconvenient for detecting temperatures of these electronic devices.

DETAILED DESCRIPTION

Figure 1:
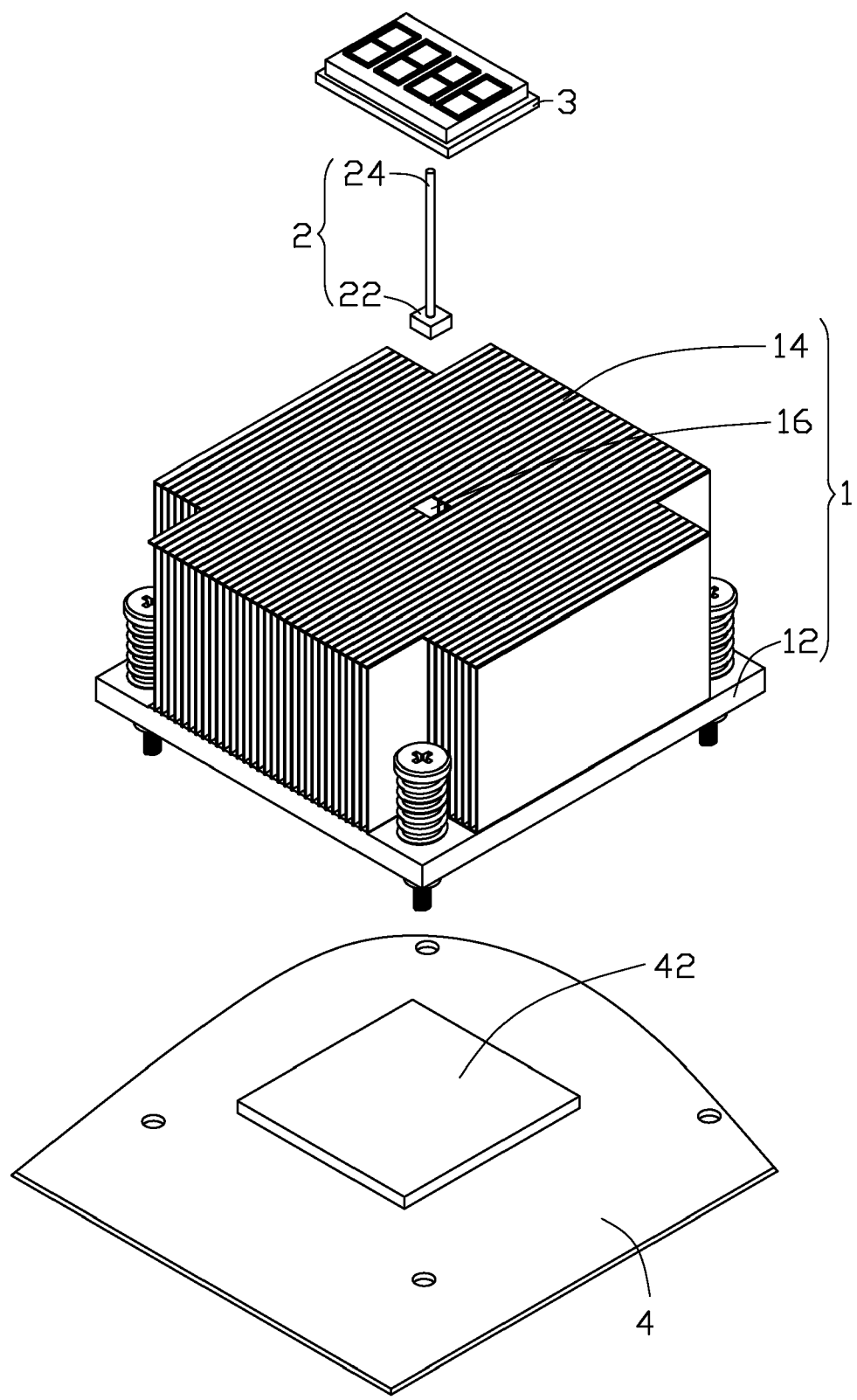
FIG. 1 is an exploded, isometric view of an exemplary embodiment of a heat sink assembly, together with a circuit board.
Figure 2:
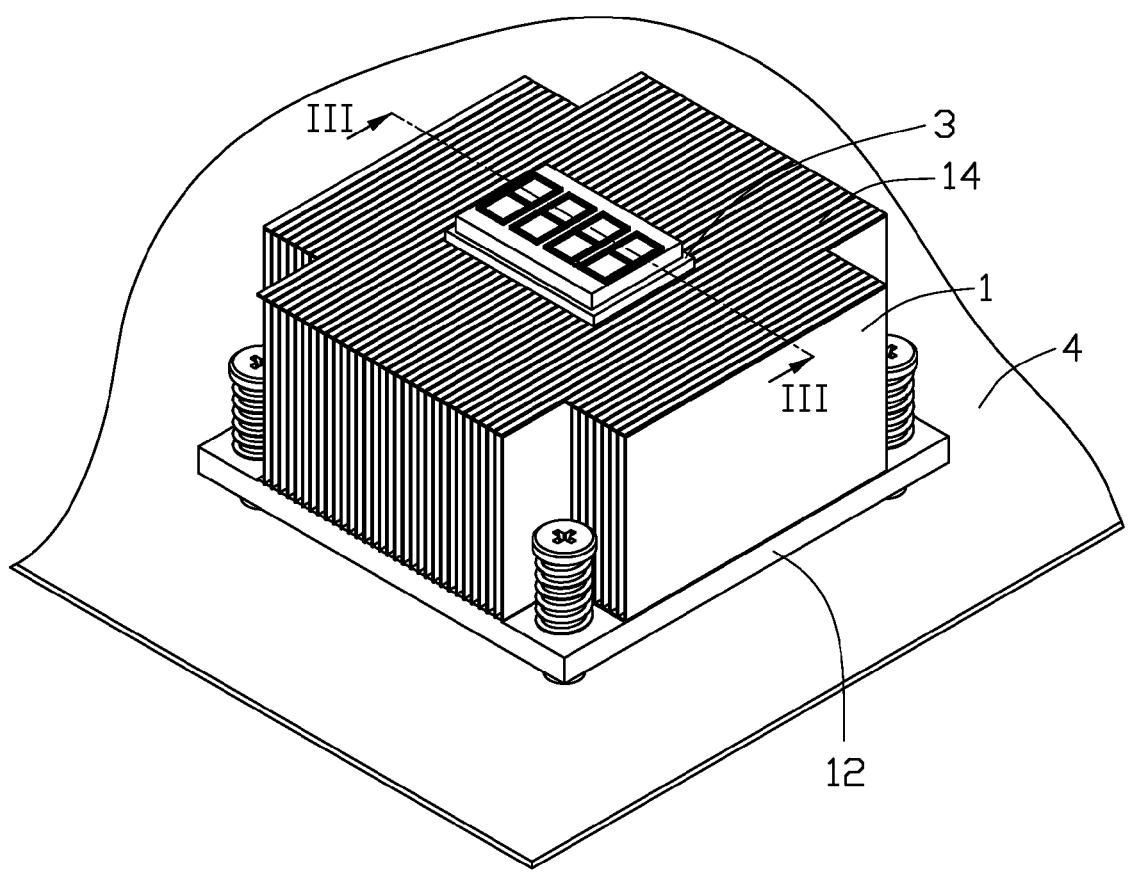
FIG. 2 is an assembled, isometric view of the heat sink assembly and the circuit board of FIG. 1.
Figure 3:
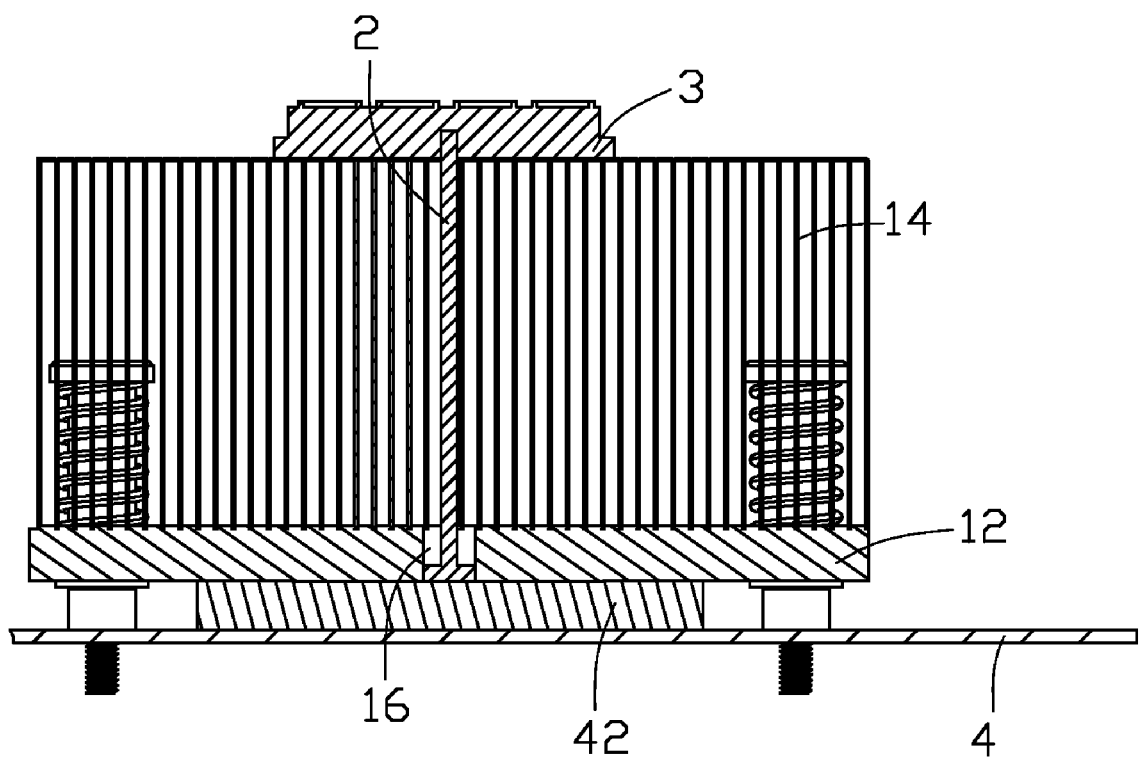
FIG. 3 is a cross-sectional view of FIG. 2, taken along the line III-III.

Referring to FIGS. 1 to 3, an exemplary embodiment of a heat sink assembly is used to dissipate heat and detect temperature of a chip 42 of a circuit board 4. The heat sink assembly includes a heat sink 1, a temperature collecting module 2, and a display module 3.

The heat sink 1 includes a conductive board 12 and a plurality of parallel fins 14 vertically extending up from the conductive board 12. A hole 16 is longitudinally defined in a center of the plurality of parallel fins 14 and through the conductive board 12.

In one embodiment, the temperature collecting module 2 is a thermocouple sensor and includes a sensing portion 22 and a signal transferring portion 24. The sensing portion 22 is used to sense temperature of the chip 42 and generate corresponding analog signals. The signal transferring portion 24 is connected to the sensing portion 22, to transfer the analog signals to the display module 3. In other embodiments, the temperature collecting module 2 can be changed to other types of sensors according to requirements.

The display module 3 is used to receive the analog signals and convert them the analog signals into digital signals, and then display the digital signals with temperature unit symbol, such as 50 degrees centigrade. It may be understood that the display module 3 may include many circuits, such as an analog-to-digital converter, a power circuit, and a display circuit, for example. These circuits are well-known circuits, and therefore are not described here.

In assembly, the temperature collecting module 2 is inserted into the hole 16. The sensor portion 22 of the temperature collecting module 2 extends through the conductive board 12. The heat sink 1 is mounted on the chip 42 with the sensing portion 22 of the temperature collecting module 2 contacting the chip 42, to effectively sense temperature of the chip 42. The signal transferring portion 24 of the temperature collecting module 2 is electrically connected to the display module 3 via leads (not shown). The display module 3 is mounted on the heat sink 1, using means such as glue, for example.

In use, the chip 42 generates heat and then the heat sink 1 dissipate the heat into the environment. During this process, the sensing portion 22 of the temperature collecting module 2 senses temperatures of the chip 42 and generates corresponding analog signals. The signal transferring portion 24 of the temperature collecting module 2 transfers the analog signals to the display module 3. The display module 3 receives the analog signals and converts the analog signals into digital signals, and then displays the digital signals with temperature unit symbol, such as 50 degrees centigrade, which is very convenient to people who concern.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat sink assembly for a chip of a circuit board, comprising:
   a heat sink comprising a conductive board to contact the chip and a plurality of fins extending up from the conductive board, the heat sink defining a hole through the plurality of fins and the conductive board, wherein the heat sink is operable to dissipate heat from the chip;
   a temperature collecting module comprising a sensing portion and a signal transferring portion, wherein the temperature collecting module is inserted into the hole of heat sink and the sensing portion contacts the chip in response to the heat sink being mounted on the circuit board, the sensing portion of the temperature collecting module senses temperatures of the chip and generates corresponding analog signals; and
   a display module directly mounted on the heat sink and connected to the signal transferring portion of the temperature collecting module, wherein the signal transferring portion of the temperature collecting module transfers the analog signals to the display module, the display module receives the analog signals and converts the analog signals into digital signals, and then displays the digital signals.

2. The heat sink assembly of claim 1, wherein the temperature collecting module is a thermocouple sensor.

3. The heat sink assembly of claim 1, wherein the hole is defined in a center of the plurality of fins of the heat sink.

4. The heat sink assembly of claim 1, wherein the display module is directly mounted on a top of the plurality of fins, opposite to the conductive board.

5. A system, comprising:
   a circuit board comprising a chip mounted on the circuit board;
   a heat sink to dissipate heat generated by the chip, the heat sink comprising a conductive board mounted on the circuit board and contacting the chip, and a plurality of fins extending up from the conductive board;
   a temperature collecting module mounted to the heat sink, the temperature collecting module comprising a sensing portion contacting the chip to sense temperatures of the chip and generate analog signals corresponding to the temperature, and a signal transferring portion connected to the sensing portion; and a display module directly mounted on the heat sink and connected to the signal transferring portion of the temperature collecting module, to receive the analog signals from the sensing portion and convert the analog signals into digital signals, the display module displaying the digital signals.

6. The system of claim 5, wherein the heat sink defines a hole through the plurality of fins and the conductive board, allowing the temperature collecting module to extend therethrough to contact the chip.

7. The system of claim 6, wherein the display module is directly mounted on a top of the plurality of fins, opposite to the conductive board.

* * * * *